United States Patent
Hsieh et al.

(10) Patent No.: US 8,927,958 B2
(45) Date of Patent: Jan. 6, 2015

(54) LIGHT-EMITTING ELEMENT WITH MULTIPLE LIGHT-EMITTING STACKED LAYERS

(71) Applicant: EPISTAR Corporation, Hsinchu (TW)

(72) Inventors: Min-Hsun Hsieh, Hsinchu (TW); Yi-Chieh Lin, Hsinchu (TW); Rong-Ren Lee, Hsinchu (TW)

(73) Assignee: EPISTAR Corporation, Hsinchu (TW)

( * ) Notice: Subject to any disclaimer, the term of this patent is extended or adjusted under 35 U.S.C. 154(b) by 0 days.

(21) Appl. No.: 13/683,476

(22) Filed: Nov. 21, 2012

(65) Prior Publication Data

US 2013/0075696 A1    Mar. 28, 2013

Related U.S. Application Data

(63) Continuation-in-part of application No. 13/546,636, filed on Jul. 11, 2012.

(30) Foreign Application Priority Data

Jul. 12, 2011 (TW) ............................ 100124718 A

(51) Int. Cl.
| | |
|---|---|
| H01L 31/00 | (2006.01) |
| H01L 27/15 | (2006.01) |
| H01L 33/00 | (2010.01) |
| H01L 33/06 | (2010.01) |
| H01L 33/08 | (2010.01) |

(52) U.S. Cl.
CPC ................ *H01L 33/06* (2013.01); *H01L 33/08* (2013.01)
USPC .................................. 257/13; 257/81; 257/99

(58) Field of Classification Search
CPC ................................. H01L 33/06; H01L 33/08
USPC ................ 257/13, 81, 103, 14, 99, 79
See application file for complete search history.

(56) References Cited

U.S. PATENT DOCUMENTS

| | | | |
|---|---|---|---|
| 5,121,706 | A | 6/1992 | Nichols et al. |
| 6,163,038 | A * | 12/2000 | Chen et al. .................... 257/103 |
| 6,621,211 | B1 * | 9/2003 | Srivastava et al. ............ 313/503 |
| 7,005,679 | B2 | 2/2006 | Tarsa et al. |
| 7,095,052 | B2 | 8/2006 | Lester |
| 7,692,202 | B2 | 4/2010 | Bensch |
| 2003/0197169 | A1 * | 10/2003 | Lee et al. ......................... 257/14 |
| 2003/0234404 | A1 * | 12/2003 | Matsuoka et al. ............. 257/103 |
| 2006/0097269 | A1 * | 5/2006 | Lester .............................. 257/79 |
| 2006/0162768 | A1 * | 7/2006 | Wanlass et al. ................ 136/262 |
| 2007/0158659 | A1 * | 7/2007 | Bensce ............................ 257/79 |

(Continued)

*Primary Examiner* — Long K Tran
*Assistant Examiner* — Dzung Tran
(74) *Attorney, Agent, or Firm* — Muncy, Geissler, Olds & Lowe, P.C.

(57) ABSTRACT

A light-emitting device includes a carrier; a first light-emitting element formed on a first portion of the carrier, including: a first MQW structure configured to emit a first light with a first dominant wavelength; a second MQW structure configured to emit a second light with a second dominant wavelength on the first MQW structure; wherein the first MQW structure and the second MQW structure both comprise InxGa1-xP or InxGa1-xAs, wherein 0<x<1; and a second light-emitting element, formed on a second portion on of the carrier, including a light-emitting stacked layer configured to emit a third light with a third dominant wavelength, wherein the third light is blue, wherein a difference between the first dominant wavelength and the second dominant wavelength is 5 nm to 30 nm.

19 Claims, 2 Drawing Sheets

(56) References Cited

U.S. PATENT DOCUMENTS

| | | | |
|---|---|---|---|
| 2008/0035910 A1* | 2/2008 | Kyono et al. | 257/14 |
| 2009/0261358 A1* | 10/2009 | Chitnis et al. | 257/88 |
| 2009/0309120 A1* | 12/2009 | Heidborn et al. | 257/99 |

* cited by examiner

LIGHT-EMITTING ELEMENT WITH MULTIPLE LIGHT-EMITTING STACKED LAYERS

RELATED APPLICATION

This application is a continuation-in-part application of U.S. application Ser. No. 13/546,636, filed Jul. 11, 2012, entitled "A LIGHT-EMITTING ELEMENT WITH MULTIPLE LIGHT-EMITTING STACKED LAYERS", which claims the right of priority based on Taiwan application Ser. No. 100124718, filed Jul. 12, 2011, the contents of which are incorporated herein by reference in their entirety.

BACKGROUND

1. Technical Field

The present disclosure relates to a light-emitting device, and more particularly, to a light-emitting device having multiple light-emitting stacked layers.

2. Description of the Related Art

Light-emitting Diode (LED) is a solid state semiconductor element including a p-n junction formed between a p-type semiconductor layer and an n-type semiconductor layer. When imposing a certain level of forward voltage to the p-n junction, holes from the p-type semiconductor layer and electrons from the n-type semiconductor layer are combined to release light. The region for light releasing is generally called light-emitting region.

The primary features of an LED include its small size, excellent CRI, high reliability, high efficiency, long life, and short initial illumination time. The LED has been applied widely to optical display devices, traffic signals, data storing devices, communication devices, illumination devices, and medical apparatuses. Along with the launch of the full-color LED, LED has gradually replaced traditional lighting apparatus such as fluorescent lights and incandescent lamps.

The price of the substrate occupies large proportion to the cost of manufacturing LED. Therefore, how to reduce the amount of utilizing substrate raises concern.

SUMMARY OF THE DISCLOSURE

A light-emitting device includes a carrier; a first light-emitting element formed on a first portion of the carrier, including: a first MQW structure configured to emit a first light with a first dominant wavelength; a second MQW structure configured to emit a second light with a second dominant wavelength on the first MQW structure; wherein the first MQW structure and the second MQW structure both comprise $In_xGa_{1-x}P$ or $In_xGa_{1-x}As$, wherein $0<x<1$;and a second light-emitting element, formed on a second portion on of the carrier, including a light-emitting stacked layer configured to emit a third light with a third dominant wavelength, wherein the third light is blue, wherein a difference between the first dominant wavelength and the second dominant wavelength is 5 nm to 30 nm.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
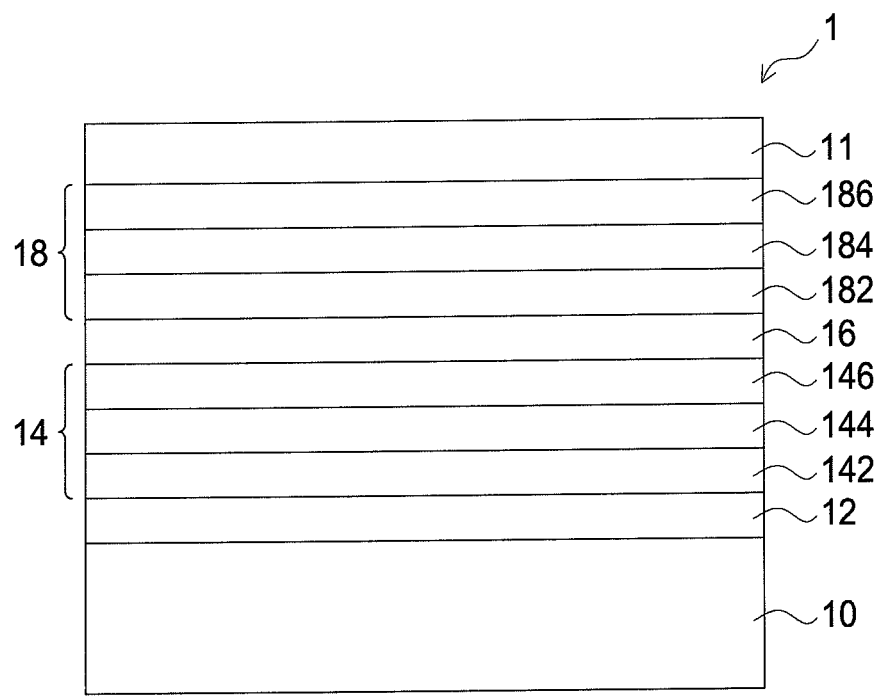
FIG. 1 illustrates a cross-sectional view of a light-emitting element in accordance with an embodiment of the present application.

FIG. 1 discloses a first light-emitting element 1 including a substrate 10; a first bonding layer 12 formed on the substrate 10; a first light-emitting stacked layer 14 formed on the first bonding layer 12; a first tunneling layer 16 formed on the first light-emitting stacked layer 14; a second light-emitting stacked layer 18 formed on the first tunneling layer 16; and a contact layer 11 formed on the second light-emitting stacked layer 18. The first light-emitting stacked layer 14 includes a first semiconductor layer 142, a first active layer 144, and a second semiconductor layer 146 formed between the substrate 10 and the first tunneling layer 16. The second light-emitting stacked layer 18 includes a third semiconductor layer 182, a second active layer 184, and a fourth semiconductor layer 186 formed between the contact layer 11 and the first tunneling layer 16. There is a light-emitting stacked layer formed on a substrate in a conventional light-emitting element. The first light-emitting element 1 includes two light-emitting stacked layers on the substrate 10 in this embodiment. One of the advantages is that the lumen of the first light-emitting element 1 is about the same as the sum of the lumen of two conventional light-emitting elements which respectively include only one active layer. Moreover, it can reduce the cost of manufacturing by reducing the amount of the substrate because the first light-emitting element 1 only uses one substrate, comparing to the two conventional light-emitting element using two substrates. The lumen is increased and the cost is decreased so the lumen per dollar (lm/dollar) is increased as well. The input power of the first light-emitting element 1 is larger than the conventional light-emitting element as well. Because the first light-emitting element 1 includes two light-emitting stacked layers and the forward voltage is increased, the input power is increased under the same operation current of the conventional light-emitting element so the lumen of the first light-emitting element 1 is increased. Furthermore, the current can be spread because the series resistance is larger than the sheet resistance of the first light-emitting element 1. The area of the first light-emitting stacked layer 14 where the current passes can be increased so the light-emitting efficiency can be improved.

Moreover, the first active layer 144 includes a first multiple quantum well (MQW) structure having a first number of MQW pairs. The MQW pair has a well and a barrier. The barrier includes an energy band gap higher than that of the well. The second active layer 184 includes a second multiple quantum well (MQW) structure having a second number of MQW pairs. The first number is different from the second number. The first number can be larger than the second number in another embodiment. When the amount of the first number and the second number is fixed, the light-emitting efficiency of the first light-emitting element 1 in this embodiment is better than that of another conventional dual-junction light-emitting element of which the first number and the second number are the same. If the amount of the first number and the second number is 10, for instance, and the first number is 7 and the second number is 3 in this embodiment, the lumen of light from the first MQW structure and the second MQW structure is the same as that from the conventional dual-junction light-emitting element of which the first number and the second number are both 5. The light-emitting efficiency of the first light-emitting element 1, however, is larger than that of the conventional dual-junction light-emitting element because the second number is less than the first number and less number of MQW pairs can absorb the light from the first MQW structure.

The substrate 10 can be for growing and/or supporting the light-emitting stacked layers thereon. The material of the substrate 10 includes insulating material such as sapphire, diamond, glass, quartz, acryl, or MN, or conductive material such as Cu, Al, diamond like carbon (DLC), SiC, metal matrix composite (MMC), ceramic matrix composite (CMC), Si, IP, GaAs, Ge, GaP, GaAsP, ZnSe, ZnO, InP, $LiGaO_2$, or $LiAlO_2$. The material of the substrate 10 for growing the light-emitting stacked layers, for example, can be sapphire, GaAs, or SiC. When substrate 10 is for growing the light-emitting stacked layers, the first bonding layer 12 can be replaced by a buffer layer for growing the light-emitting stacked layers.

The first bonding layer 12 can connect the substrate 10 and the first light-emitting stacked layer 14, and includes a plurality of sub-layers (not shown). Material of the first bonding layer 12 can be conductive material. It includes but is not limited to ITO, InO, SnO, CTO, ATO, AZO, ZTO, GZO, ZnO, YZO, IZO, DLC, Cu, Al, In, Sn, Au, Pt, Zn, Ag, Ti, Ni, Pb, Pd, Ge, Cr, Cd, Co, Mn, Sb, Bi, Ga, W, Ag—Ti, Cu—Sn, Cu—Zn, Cu—Cd, Sn—Pb—Sb, Sn—Pb—Zn, Ni—Sn, Ni—Co, and Au alloy. The material of the buffer layer can be a semiconductor material containing more than one element selected from a group consisting of Ga, Al, In, As, P, N, Zn, Cd, and Se. The first bonding layer 12 can further includes a reflective layer (not shown) to reflect light from the light-emitting stacked layers. Material of the reflective layer includes but is not limited to Cu, Al, Sn, Au, Pt, Zn, Ag, Ti, Ni, Pb, Ag—Ti, Cu—Sn, Cu—Zn, Cu—Cd, Sn—Pb—Sb, Sn—Pb—Zn, Ni—Sn, Ni—Co, Ag—Cu, or Au alloy.

The first light-emitting stacked layer 14 and/or the second light-emitting stacked layer 18 can be directly grown on the substrate 10, or fixed on the substrate 10 by the first bonding layer 12. The material of the first light-emitting stacked layer 14 and the second light-emitting stacked layer 18 includes a semiconductor material containing more than one element selected from a group consisting of Ga, Al, In, As, P, N, Zn, Cd, and Se. The polarities of the first semiconductor layer 142 and the second semiconductor layer 146 are different. The polarities of the third semiconductor layer 182 and the fourth semiconductor layer 186 are different. The first active layer 144 and the second active layer 184 can emit light, wherein the first active layer 144 includes a first band gap and the second active layer 184 includes a second band gap. The first band gap and the second band gap are different in this embodiment. The difference between the first band gap and the second band gap is between 0.3 eV and 0.5 eV. The first band gap can be smaller or larger than the second band gap. The first band gap is 1.45 eV and the second band gap is 1.9 eV, for instance. In another embodiment, the light generated from the first active layer 144 is invisible to the eyes of humans. The wavelength of the invisible light is about smaller than 400 nm or larger than 780 nm. It can be better between 780 nm and 2500 nm or between 300 nm and 400 nm, preferably between 780 nm and 900 nm, in this embodiment. The light generated from the second active layer 34 is visible to the eyes of humans. The wavelength of the visible light is about between 400 nm and 780 nm, preferably between 560 nm and 750 nm, in this embodiment. In another embodiment, the light generated from the first active layer 144 includes a first dominant wavelength and the light generated from the second active layer 184 includes a second dominant wavelength, wherein the difference between the first dominant wavelength and the second dominant wavelength is about 150 nm to 220 nm, and the first dominant wavelength can be larger or smaller than the second dominant wavelength. This embodiment can be applied to medical treatment. One of the advantages is that a single light-emitting element can include different functions, for example, the first dominant wavelength of 815 nm can promote healing the wound, and the second dominant wavelength of 633 nm can eliminate wrinkles.

In another embodiment, a first quantum well and a second quantum well are stacked alternately to form the first active layer 144. The first quantum well includes a first quantum-well band gap and the second quantum well includes a second quantum-well band gap, wherein the first quantum-well band gap is different from the second quantum-well band gap. The difference between the first quantum-well band gap and the second quantum-well band gap is about 0.06 eV to 0.1 eV, and the first quantum-well band gap can be smaller or larger than the second quantum-well band gap. A third quantum well and a fourth quantum well are stacked alternately to form the second active layer 184. The third quantum well includes a third quantum-well band gap and the fourth quantum well includes a fourth quantum-well band gap, wherein the third quantum-well band gap is different from the fourth quantum-well band gap. The difference between the third quantum-well band gap and the fourth quantum-well band gap is about 0.06 eV to 0.1 eV, and the third quantum-well band gap can be smaller or larger than the fourth quantum-well band gap.

The first tunneling layer 16 is grown on the first light-emitting stacked layer 14. The doping concentration of the first tunneling layer 16 is larger than $8 \times 10^{18}/cm^3$ so the electrons can pass it because of the tunneling effect. The material of the first tunneling layer 16 includes semiconductor material containing more than one element selected from a group consisting of Ga, Al, In, As, P, N, Zn, Cd, and Se. In another embodiment, the first tunneling layer 16 can be replaced by a second bonding layer to bond the first light-emitting stacked layer 14 to the second light-emitting stacked layer 18. The material of the second bonding layer includes transparent conductive material such as ITO, InO, SnO, CTO, ATO, ZnO, MgO, AlGaAs, GaN, GaP, AZO, ZTO, GZO, IZO, or $Ta_2O_5$, or insulating material such as Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, fluorocarbon polymer, glass, $Al_2O_3$, $SiO_2$, $TiO_2$, $SiN_x$, spin-on-glass (SOG), or tetraethoxysilane (TEOS). The contact layer 11 is for conducting current. The material of the contact layer 11 includes GaP, $Al_xGa_{1-x}As$ ($0 \le x \le 1$), or $Al_aGa_bIn_{1-a-b}P$ ($0 \le a \le 1$, $0 \le b \le 1$, $0 \le a+b \le 1$).

Figure 2:
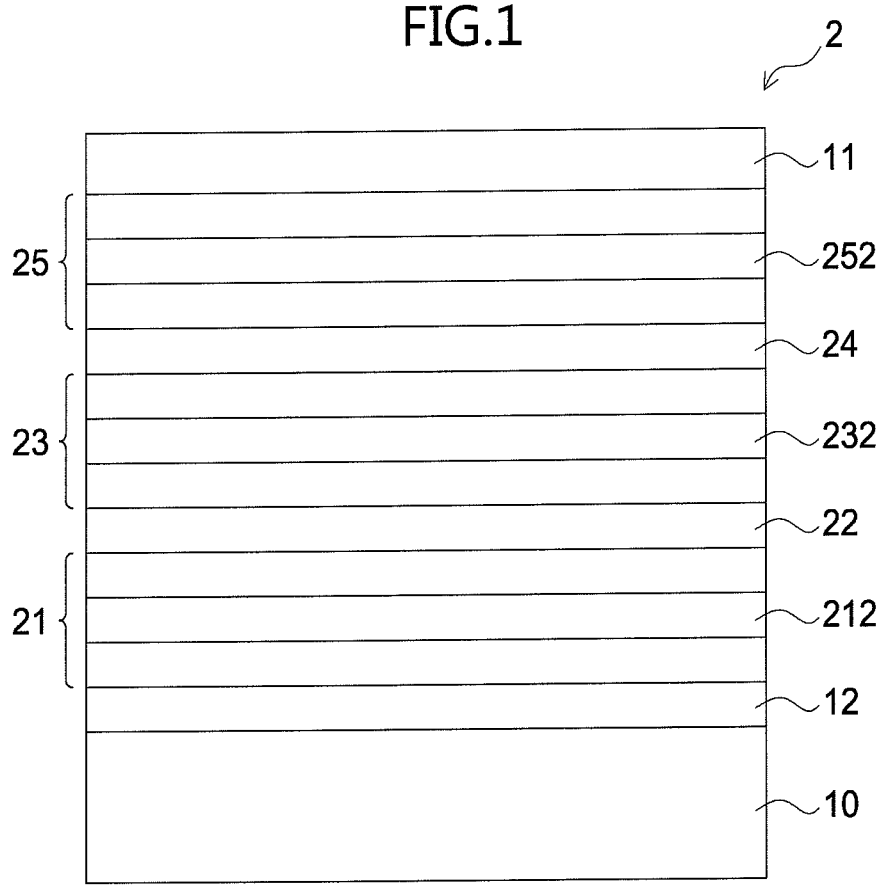
FIG. 2 illustrates a cross-sectional view of a light-emitting element in accordance with another embodiment of the present application.

FIG. 2 discloses a first light-emitting element 2 including a substrate 10; a first bonding layer 12 formed on the substrate 10; a first light-emitting stacked layer 21 formed on the first bonding layer 12; a first tunneling layer 22 formed on the first light-emitting stacked layer 21; a second light-emitting stacked layer 23 formed on the first tunneling layer 22; a second tunneling layer 24 formed on the second light-emitting stacked layer 23; a third light-emitting stacked layer 25 formed on the second tunneling layer 24; and a contact layer 11 formed on the third light-emitting stacked layer 25. The first light-emitting stacked layer 21 includes a first active layer 212, the second light-emitting stacked layer 23 includes a second active layer 232, and the third light-emitting stacked layer 25 includes a third active layer 252. The first light-emitting element 2 includes three light-emitting stacked layers on the substrate 10 in this embodiment. One of the advantages is that the lumen of the first light-emitting element 2 is about the same as the sum of the lumen of three conventional light-emitting elements. Moreover, it can reduce the cost of manufacturing by reducing the amount of the substrate because the first light-emitting element 2 only uses one substrate, while the three conventional light-emitting elements use three substrates. The lumen is increased and the cost is decreased so the lumen per dollar (lm/dollar) is increased as well. The input power of the first light-emitting element 2 is larger than the conventional light-emitting element as well. Because the first light-emitting element 2 includes three light-emitting stacked layers and the forward voltage is increased, the input power is increased under the same operation current of the conventional light-emitting element and the lumen of the first light-emitting element 2 is increased. Furthermore, the current can be spread because the series resistance is larger than the sheet resistance of the first light-emitting element 2. The area of the first light-emitting stacked layer 21 where the current passes can be increased so the light-emitting efficiency can be improved.

Moreover, the first active layer 212 includes a first MQW structure having a first number of MQW pairs. The MQW pair has a well and a barrier. The barrier includes an energy band gap higher than that of the well. The second active layer 232 includes a second MQW structure having a second number of MQW pairs. The third active layer 252 includes a third MQW structure emitting a fourth light with a fourth dominant wavelength and having a third number of MQW pairs. The first number, the second number, and the third number are different from each other. The first number can be larger than the second number and the second number can be larger than the third number in another embodiment. When the amount of the first number, the second number, and the third number are fixed, the light-emitting efficiency of the first light-emitting element 2 in this embodiment is better than that of a conventional triple-junction light-emitting element of which the first number, the second number, and the third number are the same. If the amount of the first number, the second number, and the third number is 15, for instance, and the first number is 7, the second number is 5, and the third number is 3 in this embodiment, the lumen of light from the first MQW structure, the second MQW structure, and the third MQW structure is about the same as that from the conventional triple-junction light-emitting element of which the first number, the second number, and the third number are 5. The light-emitting efficiency of the first light-emitting element 2, however, is larger than that of the conventional triple-junction light-emitting element because the second number or the third number is less than the first number and less number of MQW pairs can absorb the light from the first MQW structure.

Figure 3:
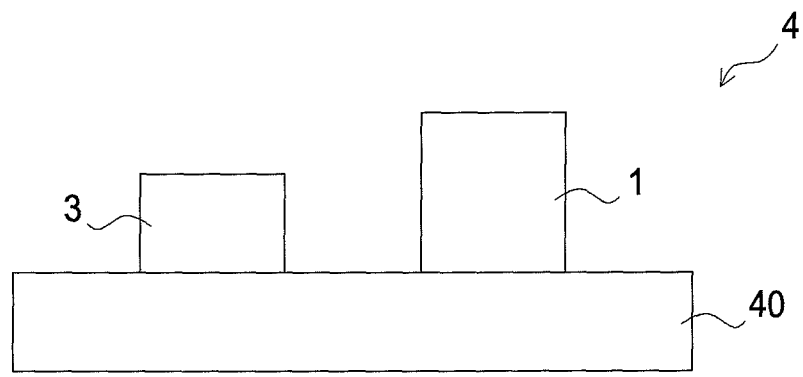
FIG. 3 illustrates a cross-sectional view of a light-emitting device in accordance with an embodiment of the present application.

Referring to FIG. 3, a light-emitting device 4 includes a carrier 40; the first light-emitting element 1 formed on a portion of the carrier 40; and a second light-emitting element 3 formed on another portion of the carrier 40. The first light-emitting element 1 includes the first light-emitting stacked layer 14 emitting a first light having the first dominant wavelength and the second light-emitting stacked layer 18 emitting a second light having the second dominant wavelength, wherein the first dominant wavelength is different from the second dominant wavelength. The second light-emitting element 3 includes a third light-emitting stacked layer (not shown) emitting a third light having a third dominant wavelength. The third dominant wavelength can be different from the first dominant wavelength and the second dominant wavelength. The first light, the second light, and the third light can be mixed to generate a mixed light which has better color rendering index (CRI) because the first light, the second light, and the third light have different dominant wavelengths which show different colors. For example, the mixed light is white light which includes the first light which is red, the second light which is green, and the third light which is blue. In another embodiment, the second light-emitting element 3 can further include a wavelength conversion layer (not shown) thereon to generate the third light which is cool white light of which color temperature is about between 5700K and 6500K. The first light-emitting element 1 can emit the first light and the second light of which the dominant wavelengths are different. The first light, the second light, and the third light can be mixed to generate the mixed light which is warm white light of which color temperature is about between 2700K and 3000K so CRI of the light-emitting device 4 is better than a conventional light-emitting device of which the first light-emitting element has only one dominant wavelength. The CRI of the light-emitting device 4 can be at least 80, preferably at least 90, and strong red index R9 is at least 50. The first light and the second light can show the same color such as red. In one embodiment, the first active layer 144 comprises a multi-quantum well structure having a plurality of first well layers and a plurality of first barrier layers laminated alternatively, and the second active layer 184 comprises a multi-quantum well structure having a plurality of second well layers and a plurality of second barrier layers laminated alternatively. The material of the first well layer and the second well layer includes a material generally expressed as $In_xGa_{1-x}P$ or $In_xGa_{1-x}As$, wherein $0<x<1$, and the indium proportion indicated as x in the first well layer is greater than the indium proportion in the second well layer. The difference between the first indium proportion and the second indium proportion is between about 1% and 6%, preferably between about 2% and 5%. The difference between the first dominant wavelength and the second dominant wavelength can be between about 5 nm and 30 nm, preferably between about 10 nm and 25 nm. The first dominant wavelength can be about 615 nm~635 nm and the second dominant wavelength can be about 605 nm~625 nm in this embodiment, for example.

The carrier 40 can be for growing and/or supporting the light-emitting elements thereon. The material of the carrier 40 includes insulating material such as sapphire, diamond, glass, quartz, acryl, ZnO, or MN, or conductive material such as Cu, Al, diamond like carbon (DLC), SiC, metal matrix composite (MMC), ceramic matrix composite (CMC), Si, IP, ZnSe, GaAs, Ge, GaP, GaAsP, InP, $LiGaO_2$, or $LiAlO_2$. The material of the carrier 40 for growing light-emitting structures, for example, can be sapphire, GaAs, or SiC.

Figure 4:
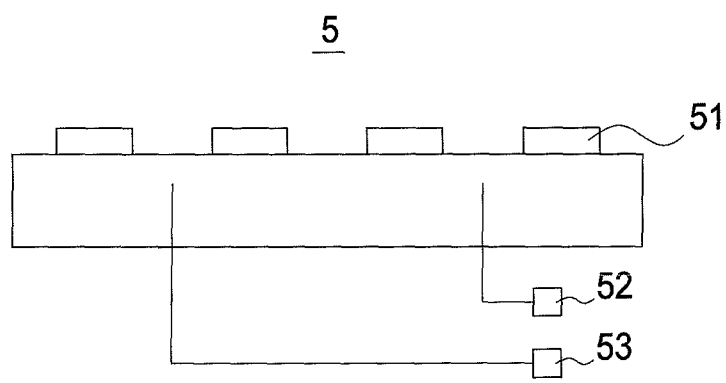
FIG. 4 illustrates a schematic diagram of a light-generating device in accordance with an embodiment of the present application.

FIG. 4 illustrates a schematic diagram of a light-generating device 5. The light-generating device 5 includes the light-emitting device or the light-emitting element of any one of the foregoing embodiments of the present application. The light-generating device 5 can be an illumination device such as a street light, a lamp of vehicle, or an illustration source for interior. The light-generating device 5 can be also a traffic sign or a backlight of a backlight module of an LCD. The light-generating device 5 includes a light source 51 adopting any foregoing light-emitting devices; a power supplying system 52 providing current to the light source 51; and a control element 53 controlling the power supplying system 52.

Figure 5:
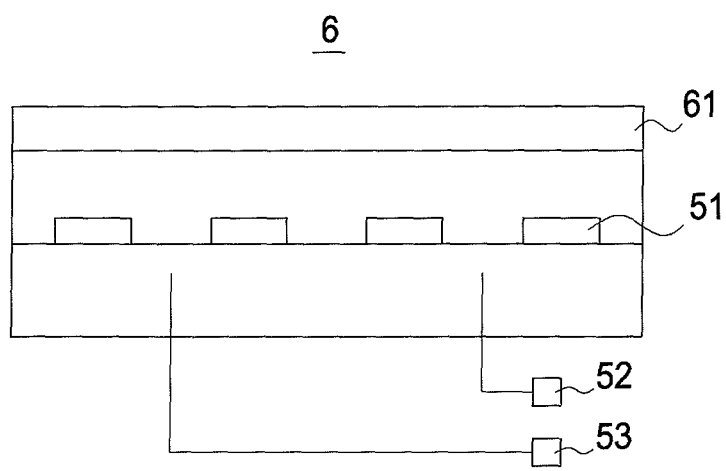
FIG. 5 illustrates a schematic diagram of a back light module in accordance with an embodiment of the present application.

FIG. 5 illustrates a schematic diagram of a back light module 6. The back light module 6 includes the light-generating device 5 of the foregoing embodiment and an optical element 61. The optical element 61 can process the light generated by the light-generating device 5 for LCD application, such as scattering the light emitted from the light-generating device 5.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a carrier;
a first light-emitting element, formed on a first portion of the carrier, comprising:
a first MQW structure configured to emit a first light with a first dominant wavelength;
a second MQW structure configured to emit a second light with a second dominant wavelength on the first MQW structure;
wherein the first MQW structure and the second MQW structure both comprise $In_xGa_{1-x}P$ or $In_xGa_{1-x}As$, wherein $0<x<1$; and
a second light-emitting element, formed on a second portion of the carrier, comprising a light-emitting stacked layer configured to emit a third light with a third dominant wavelength, wherein the third light is blue,
wherein a difference between the first dominant wavelength and the second dominant wavelength is 5 nm to 30 nm.

2. The light-emitting device of claim 1, wherein the first light, the second light, and the third light are mixed to generate a mixed light, and CRI of the mixed light is at least 90.

3. The light-emitting device of claim 2, wherein R9 of the mixed light is at least 50.

4. The light-emitting device of claim 1, wherein the second dominant wavelength is larger than the third dominant wavelength.

5. The light-emitting device of claim 1, further comprising a wavelength conversion layer on the second light-emitting element.

6. The light-emitting device of claim 1, wherein the first light and the second light are substantially red light.

7. The light-emitting device of claim 1, further comprising a bonding layer between the carrier and the first MQW structure.

8. The light-emitting device of claim 5, wherein the second light-emitting element emits cool white light; the first light, the second and cool white light are mixed to generate a mixed light which is warm white light.

9. The light-emitting device of claim 1, wherein the difference between first dominant wavelength and the second dominant wavelength is between 10 nm and 25 nm.

10. The light-emitting device of claim 1, wherein the first MQW structure comprising a first well layer with a first indium proportion, the second MQW structure comprising a second well layer with a second indium proportion, and a difference between the first indium proportion and the second indium proportion is between 1% to 6%.

11. The light-emitting device of claim 10, wherein the first MQW structure is between the second MQW structure and the carrier, and the first indium proportion is larger than the second indium proportion.

12. The light-emitting device of claim 1, wherein the first MQW structure is between the second MQW structure and the carrier, and the first dominant wavelength is larger than the second dominant wavelength.

13. The light-emitting device of claim 1, wherein the first MQW structure comprises a first number of MQW pairs, the second MWQ structure comprises a second number of MQW pairs, and the first number is different from the second number.

14. The light-emitting device of claim 13, wherein the first MQW structure is between the second MQW structure and the carrier, and the first number is larger than the second number.

15. The light-emitting device of claim 13, further comprising a third MQW structure having a third number of MQW pairs on the second MQW structure.

16. The light-emitting device of claim 15, wherein the first number is larger than the second number and the third number is smaller than the second number.

17. The light-emitting device of claim 15, further comprising a first tunneling layer between the first MQW structure and the second MQW structure and a second tunneling layer between the third MQW structure and the second MQW structure.

18. The light-emitting device of claim 15, wherein the third MQW structure emits a fourth light with a fourth dominant wavelength, and the first dominant wavelength, the second dominant wavelength, and the fourth dominant wavelength are different from each other.

19. The light-emitting device of claim 18, wherein the first dominant wavelength is larger than the second dominant wavelength and the second dominant wavelength is larger than the fourth dominant wavelength.

* * * * *